(12) United States Patent
Bharitkar et al.

(10) Patent No.: US 7,016,509 B1
(45) Date of Patent: Mar. 21, 2006

(54) SYSTEM AND METHOD FOR VARYING LOW AUDIO FREQUENCIES INVERSELY WITH AUDIO SIGNAL LEVEL

(75) Inventors: Sunil Bharitkar, Los Angeles, CA (US); Timothy Shuttleworth, Woodland Hills, CA (US)

(73) Assignee: Harman International Industries, inc., Northridge, CA (US)

( * ) Notice: Subject to any disclaimer, the term of this patent is extended or adjusted under 35 U.S.C. 154(b) by 854 days.

(21) Appl. No.: 09/658,010

(22) Filed: Sep. 8, 2000

(51) Int. Cl.
*H03G 5/00* (2006.01)

(52) U.S. Cl. .......................... 381/98; 381/101; 381/103

(58) Field of Classification Search ................. 381/98, 381/101, 102, 103, 109, 104, 108; 333/285
See application file for complete search history.

(56) References Cited

U.S. PATENT DOCUMENTS

| | | | |
|---|---|---|---|
| 4,055,818 A | 10/1977 | Gay | |
| 4,113,983 A | 9/1978 | Steel | |
| 4,118,604 A | 10/1978 | Yanick | |
| 4,130,727 A | 12/1978 | Kates | |
| 4,179,669 A | 12/1979 | Dodson et al. | |
| 4,207,543 A | 6/1980 | Izakson et al. | |
| 4,239,939 A | 12/1980 | Griffis | |
| 4,289,928 A | 9/1981 | Takaoka et al. | |
| 4,292,468 A | 9/1981 | Yokoyama | |
| 4,320,534 A | 3/1982 | Sakai et al. | |
| 4,376,916 A | 3/1983 | Glaberson | |
| 4,398,157 A | 8/1983 | Dieterich | |
| 4,412,100 A | 10/1983 | Orban | |
| 4,432,097 A | 2/1984 | Okada et al. | |

(Continued)

OTHER PUBLICATIONS

Internet Printout Entitled "Sound Propagation" Dated Nov. 1995.

(Continued)

*Primary Examiner*—Vivian Chin
*Assistant Examiner*—Justin Michalski

(57) ABSTRACT

The present invention relates to an auto loudness circuit for performing loudness compensation automatically depending on the signal level. When the signal level decreases, loudness compensation is slowly introduced and as the signal level increases, loudness compensation is quickly removed. To do so, the auto loudness circuit utilizes a filter circuit with the characteristic of a first order bass boost. The filter circuit maintains a corner frequency which is proportional to the inverse of audio level in order to mimic the Fletcher-Munson curves. Because the circuit employs a capacitance-multiplier with a first order resistance capacitance filter, the bass boost is inversely proportional to the signal level. Thus, bass boost is achieved automatically as the program content changes so that the listener is unaware of significant changes in program material as signal levels change either through increase or decrease in volume, crescendo or new material.

31 Claims, 9 Drawing Sheets

U.S. PATENT DOCUMENTS

| | | | |
|---|---|---|---|
| 4,451,746 A | | 5/1984 | Hirose et al. |
| 4,462,008 A | | 7/1984 | Katakura |
| 4,490,843 A | | 12/1984 | Bose et al. |
| 4,538,297 A | | 8/1985 | Waller, Jr. |
| 4,633,501 A | | 12/1986 | Werrbach |
| 4,661,851 A | * | 4/1987 | Muterspaugh ............. 348/485 |
| 4,668,988 A | | 5/1987 | Sasaki et al. |
| 4,739,514 A | | 4/1988 | Short et al. |
| 4,759,065 A | | 7/1988 | Field et al. |
| 4,764,938 A | | 8/1988 | Meyer |
| 4,809,338 A | * | 2/1989 | House ........................ 381/103 |
| 5,172,358 A | * | 12/1992 | Kimura .................. 369/47.26 |
| 5,172,417 A | * | 12/1992 | Iwamura .................... 381/103 |
| 5,229,734 A | | 7/1993 | Wondra et al. |
| 5,325,440 A | | 6/1994 | Fujisawa et al. |
| 5,359,665 A | * | 10/1994 | Werrbach ................... 381/102 |
| 5,481,617 A | | 1/1996 | Bjerre |
| 5,509,080 A | | 4/1996 | Roberts |
| 5,754,668 A | | 5/1998 | Funahashi et al. |
| 5,812,687 A | * | 9/1998 | Onetti et al. .................. 381/97 |
| 5,892,832 A | | 4/1999 | Beyer et al. |

OTHER PUBLICATIONS

Internet Printout Entitled "Subwoofer Builder's Manual" Copyrighted 1998.

Internet Printout Entitled "Cassette & Radio Speakers" Copyrighted 1997-98.

Drawings Taken From U.S. Patent No. 4,809,338 (Undated).

Internet Printout Entitled "The Basics of Sound and Audio for Speaker Design" Dated Mar. 30, 2000.

Internet Printout Entitled "Fletcher Munson Curves" Copyrighted 1998 by Raymund Guerrero.

Internet Printout Entitled "Direct Acoustics Speakers—Lexicon" (Part One) Copyrighted 1998.

Internet Printout Entitled "Sealed Rear Chamber Bandpass Subwoofer Design Tips" Copyrighted 1997-2000.

Internet Printout Entitled "Introduction to Acoustics" from Geoff Martin's Audio Pages.

Internet Printout Entitled Direct Acoustics Speakers—Lexicon (Part Two) Copyrighted 1998.

* cited by examiner

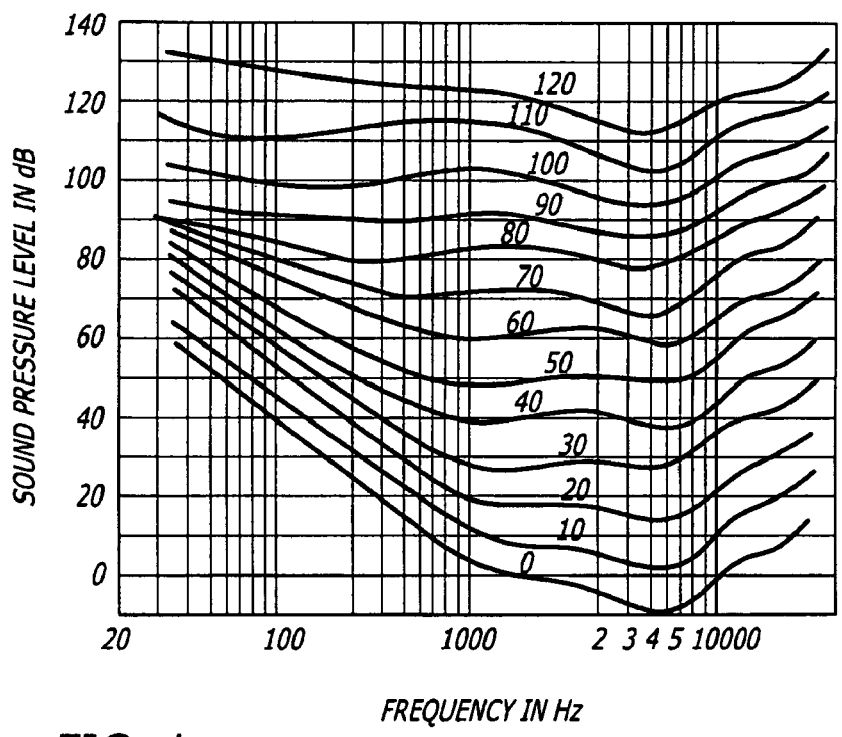
FIG. 1  FLETCHER-MUNSON CURVES
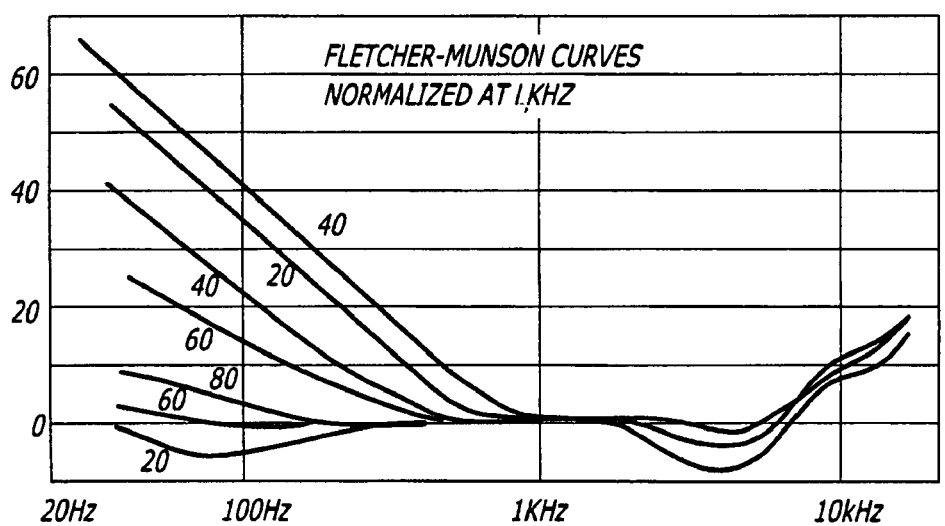
FIG. 2

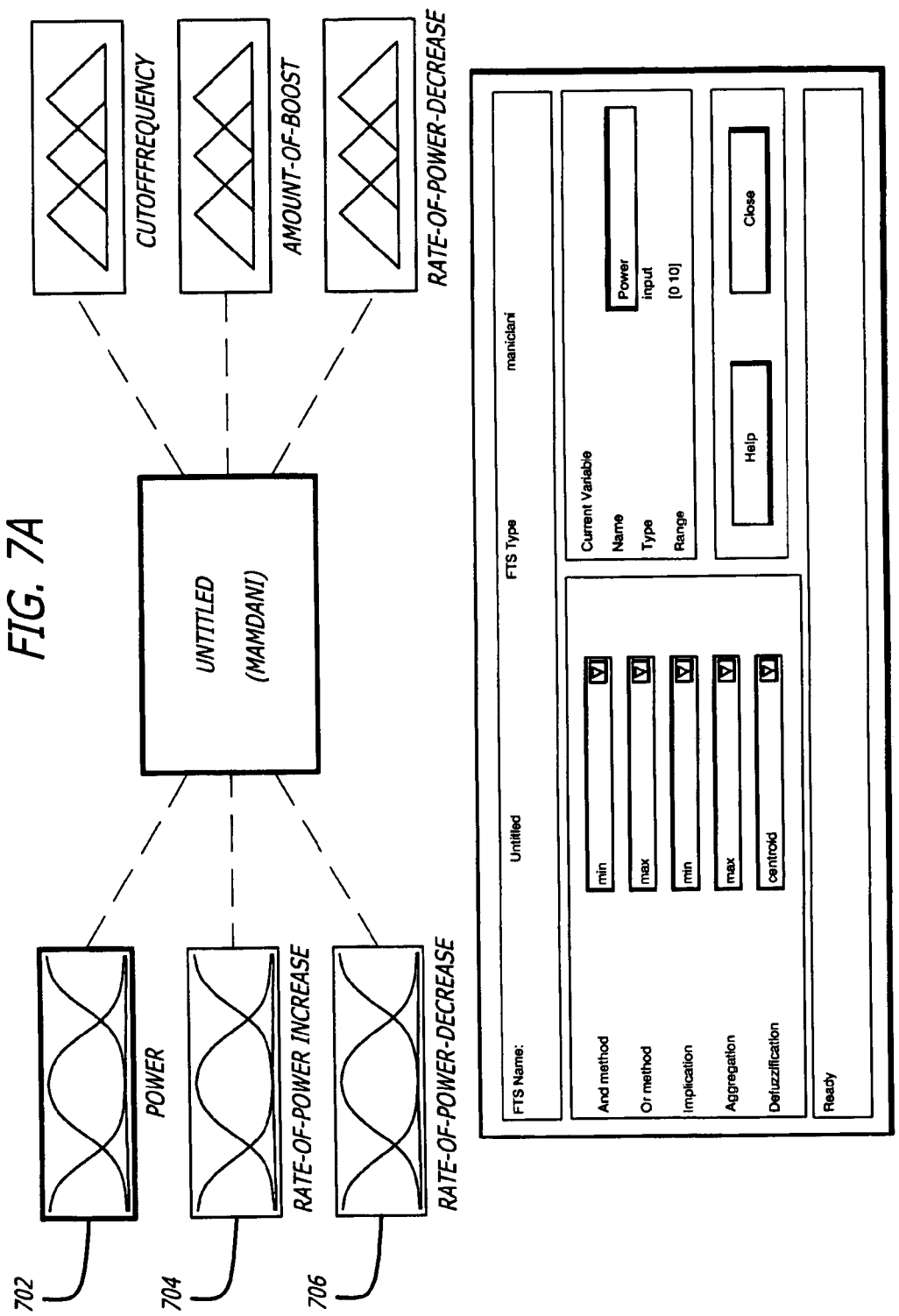

SYSTEM AND METHOD FOR VARYING LOW AUDIO FREQUENCIES INVERSELY WITH AUDIO SIGNAL LEVEL

I. FIELD OF THE INVENTION

The present invention relates in general to audio speakers and in particular to a method and apparatus based upon the characteristics of the Fletcher-Munson curves for obtaining automatic compensation and equalization of program content as the input signal changes.

II. BACKGROUND OF THE INVENTION

The Fletcher-Munson findings are well known in the prior art and generally teach that as the signal level of program material is lowered, the responsiveness of the human ear decreases. The result is that at low volume levels, the human ear is less able to hear bass sounds. Presently, many audio systems utilize a manual loudness control to boost low and high-end response at low volume levels in order to compensate for the decreased responsiveness of the human ear. Such a manual loudness control circuit is illustrated in U.S. Pat. No. 4,490,843.

Other circuits relate to improving the sound quality in automotive systems by implementing a controllable bass contour network coupled to the program source material. However, these circuits utilize notch filters for equalizing the frequency resonance within a vehicle's interior. These circuits also use a feedback circuit to detect and adjust bass levels. Such circuits are shown in U.S. Pat. Nos. 4,809,338 and 4,759,065.

Still other circuits provide automatic loudness compensation to bass boost at 60 Hz. One such circuit utilizes a 2:1 compressor so that the input signals can be compressed such a circuit is shown in U.S. Pat. No. 4,739,514.

It would be advantageous to have a circuit that automatically compensates for the decrease in program material at lower volumes by mimicking the Fletcher Munson curves using the r.m.s. (root mean square) value of an audio signal to boost bass within the 40–80 dB range. The circuit would be useful in restaurants, stores or high quality home stereo systems to boost the bass content of an input audio signal as the strength of the signal decreases.

In one embodiment, a circuit with characteristics of first order bass boost would automatically boost bass by altering the corner frequency of a circuit filter depending on the input signal. A method of providing an automatic loudness compensation circuit comprises receiving an input audio signal containing bass content, coupling the input audio signal to a voltage detector, coupling an output voltage of the voltage detector to a filter circuit, wherein the filter circuit adjusts a corner frequency associated with the filter such that the corner frequency is inversely related to the input audio signal to boost the bass content of the input audio signal, coupling an output of the filter circuit to a power amplifier for amplifying the filter circuit output, and driving an audio speaker with the amplified filter circuit output.

An apparatus according to the invention comprises a terminal for receiving an audio input signal, a power supply voltage having sufficient voltage to drive an audio output speaker, an R.M.S. detector for providing an R.M.S. voltage from the audio input signal, a variable low pass filter circuit for adjusting a corner frequency associated with the low pass filter such that the corner frequency is inversely related to the audio input signal and supplying an output signal which is increased as the audio input signal decreases, a power amplification stage for increasing the power of the output signal from the low pass filter circuit, and a terminal for providing an amplified output signal.

According to another aspect of the invention, there may be a digital signal processor (DSP) filter utilized such that in addition to altering the corner frequency, the DSP filter could also simulate varying the order of the circuit. By controlling the order of the filter circuit, the roll-off associated with the corner frequency could be adjusted to allow for a more accurate simulation of the Fletcher-Munson curves.

III. SUMMARY OF THE INVENTION

The present invention relates to an auto loudness circuit for performing loudness compensation automatically depending on the signal level. When the signal level decreases, loudness compensation is slowly introduced and as the signal level increases, loudness compensation is quickly removed.

In the present invention, an auto loudness circuit utilizes a filter circuit with the characteristic of a first order bass boost. The filter circuit maintains a corner frequency that is proportional to the inverse of audio level in order to mimic the Fletcher-Munson curves. Because the circuit employs a capacitance-multiplier with a first order resistance capacitance filter, the bass boost is inversely proportional to the signal level. Thus, bass boost is achieved automatically as the program content changes so that the listener is unaware of significant changes in program material as signal levels change either through increase or decrease in volume, crescendo or new material.

The circuit of the present invention measures the power of the input signal and varies the corner frequency of the filter to be inversely proportional to the input signal. The corner frequency, which is also known as the cut-off frequency, is the highest frequency in the band pass of a filter. However, filters do not immediately cut-off frequencies at the corner frequency due to the limitations of electronic components. Instead, a roll-off results which is the reduction of the signal level as the frequency of the signal moves away from the corner frequency. Signals above the cut-off frequency, which in this application is a very low frequency that is adjusted according to the signal power, decrease in amplitude that results in a decreasing effect.

Thus, in one embodiment of the present invention, the corner frequency is proportional to the boost to the signal as it is varied inversely with the signal level. For instance, at high signal levels, where bass is easily heard, the corner frequency of the circuit is set to a very low frequency. This way, with an extremely low value of the corner frequency, no boosting to the bass is applied since none is necessary. But at low signal levels, the corner frequency is shifted to a higher frequency level and begins to result in a boost the bass content of the input audio signal. As the corner frequency increases, the amount of bass boosting continues to increase. In this embodiment the variable cut-off frequency low pass filter is used in a positive feedback arrangement to boost through gain at low frequencies. Alternatively the same result could be achieved using a high pass filter in a negative feedback arrangement to remove through gain boost at higher frequencies.

In another embodiment, a digital signal processing (DSP) circuit may be utilized to adjust the order of the filter to more closely match the Fletcher-Munson curves. In this embodiment, a DSP based on an adaptive number of filter taps (order) is used. The order is determined by the signal level.

Moreover, the DSP also controls the corner frequency as discussed above. Thus, as the signal level decreases, the order of the filter increases to allow for sharper roll-off from the corner frequency. The result is a closer simulation of the Fletcher-Munson curves.

In yet another embodiment of the invention, a fuzzy signal processing based system may be utilized. In this embodiment, the input information such as power, rate of increase/decrease of power is encoded, then processed by an expert system, and then decoded to generate outputs such as corner frequency and bass boost.

Thus, it is an object of the present invention to provide a circuit with characteristics of a first order bass boost.

It is another object of the present invention to control the corner frequency of a filter in order to automatically control the loudness compensation of an input audio signal.

It is still another object of the present invention to boost the bass content slowly when the input audio signal decreases and remove the bass boosting quickly when the input audio signal increases such that the bass boost action is not observed by a listener as volume level declines and does not damage audio equipment as volume level increases.

Further, it is an object of the present invention to utilize a capacitance-multiplier circuit to vary the bass boost inversely with the audio signal.

Still further, it is an object of the present invention to utilize a variable capacitor circuit to vary the bass boost inversely with the audio signal.

It is still another object of the present invention to utilize a digital signal filter processing circuit in addition to controlling the filter corner frequency to more accurately mimic the Fletcher-Munson curves.

Thus, the present invention relates to a method comprising receiving an input audio signal, coupling the input audio signal to a filter circuit to recover the audio signal, adjusting the corner frequency of the filter circuit as the input audio signal changes, utilizing this filter in a feedback configuration thus boosting the bass slowly when the input audio signal decreases, removing the bass boosting quickly when the input audio signal increases, and driving the audio speaker with the automatic boosting compensation.

The invention also relates to apparatus for obtaining automatic bass boost compensation comprising a terminal for receiving an audio input signal, an R.M.S. (root mean square) detector, a variable corner frequency filter circuit for modifying the corner frequency as audio input signal changes, and a capacitance multiplier controlled by an opto-coupled resistor.

Yet, another embodiment of the automatic bass boost compensation circuit is disclosed which utilizes a DSP filter circuit that is particularly useful for more accurate simulation of the Fletcher-Munson curves.

IV. BRIEF DESCRIPTION OF THE DRAWINGS

These and other features of the present invention will be more fully disclosed when taken in conjunction with the following Detailed Description of the Embodiment(s) which like numerals represent like elements and in which:

FIG. 1 is a frequency domain relative level diagram illustrating the Fletcher-Munson curves;

FIG. 2 is a frequency domain relative level diagram illustrating the Fletcher-Munson curves normalized at 1 KHz;

FIG. 7A is an embodiment of a fuzzy logic method for loudness compensation;

V. DETAILED DESCRIPTION OF THE INVENTION

FIG. 1 illustrates a set of well-known frequency domain relative level curves first developed by Fletcher and Munson in the early 1930's. These frequency domain relative level curves (equal loudness contours) relate to the frequency response of a human ear to the level of signals being heard. As the signal level decreases, research shows that the responsiveness to the signal by the human ear alters, in particular, in relation to this invention, responsiveness to bass frequencies decreases.

Referring to FIG. 2, a set of frequency domain relative level curves illustrates the results from the Fletcher-Munson curves after being 'normalized' at 1 kHz. Since the Fletcher-Munson curves of FIG. 1 are stable at 1 kHz, the curves were normalized at that frequency. The curves were normalized in order to determine the desired output characteristics for a circuit that performs according to the normalized curves. Thus, the filter circuit of the present invention was designed to perform by closely simulating the Fletcher-Munson curves normalized at 1 kHz.

Figure 3:
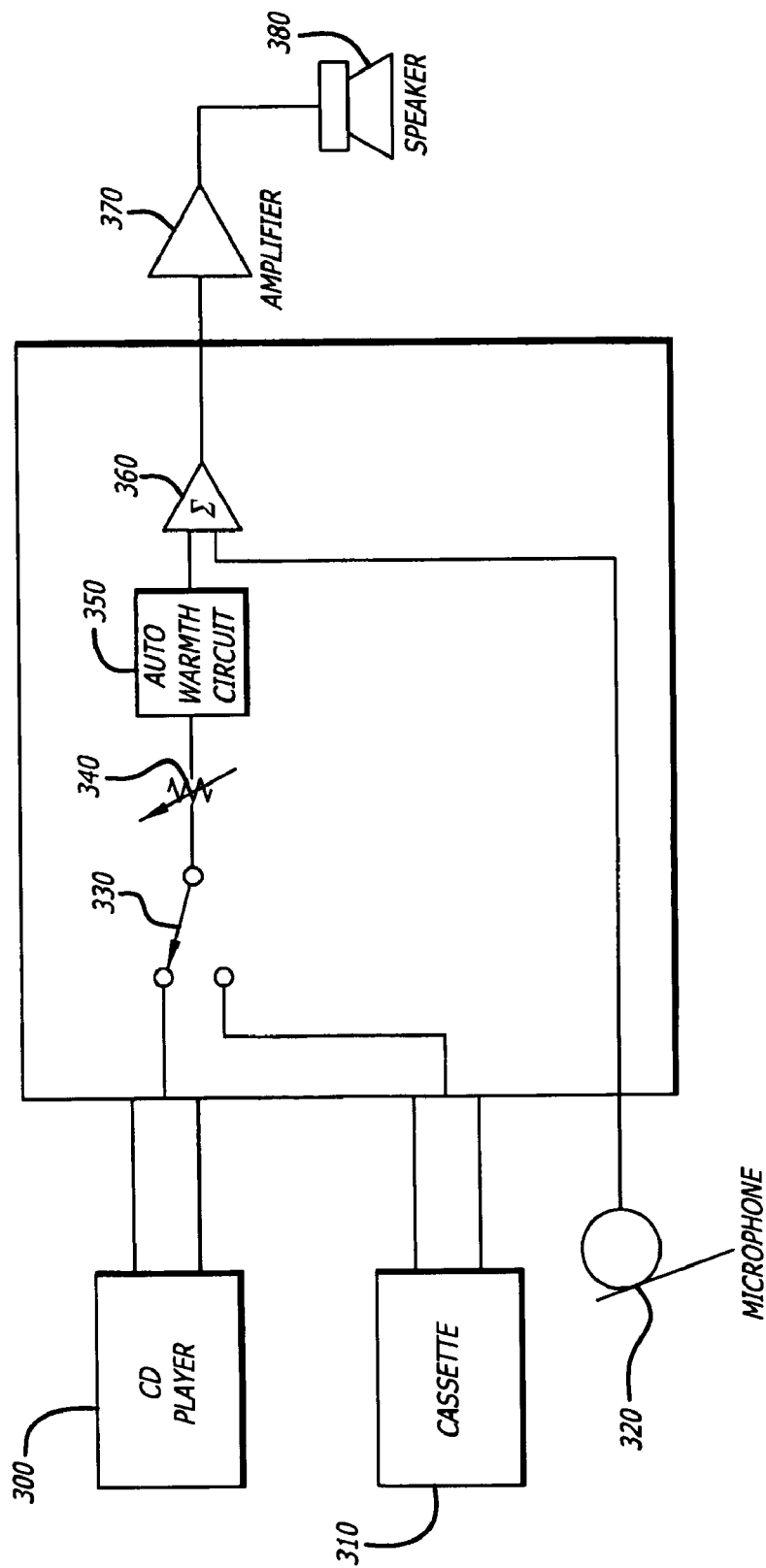
FIG. 3 is a system block diagram of the present invention.

FIG. 3 is a system diagram of the present invention. A compact disc (CD) player 300 or a cassette player 310 may be connected to the system of the present invention as sources of musical content. Switch 330 is controlled by an operator to select the source of the music. Then a level control 340 may be used to remotely determine the level of the audio signal that is then supplied to the circuit. As will be discussed in more detail below, the circuit 350 determines the volume level of the audio signal in order to determine whether bass boost of the bass content of the audio signal is required. The output of the summer 360 is amplified by amplifier 370 and the output of the amplifier 370 is then sent to the speaker 380 to implement the bass boosting compensation if required.

Figure 4:
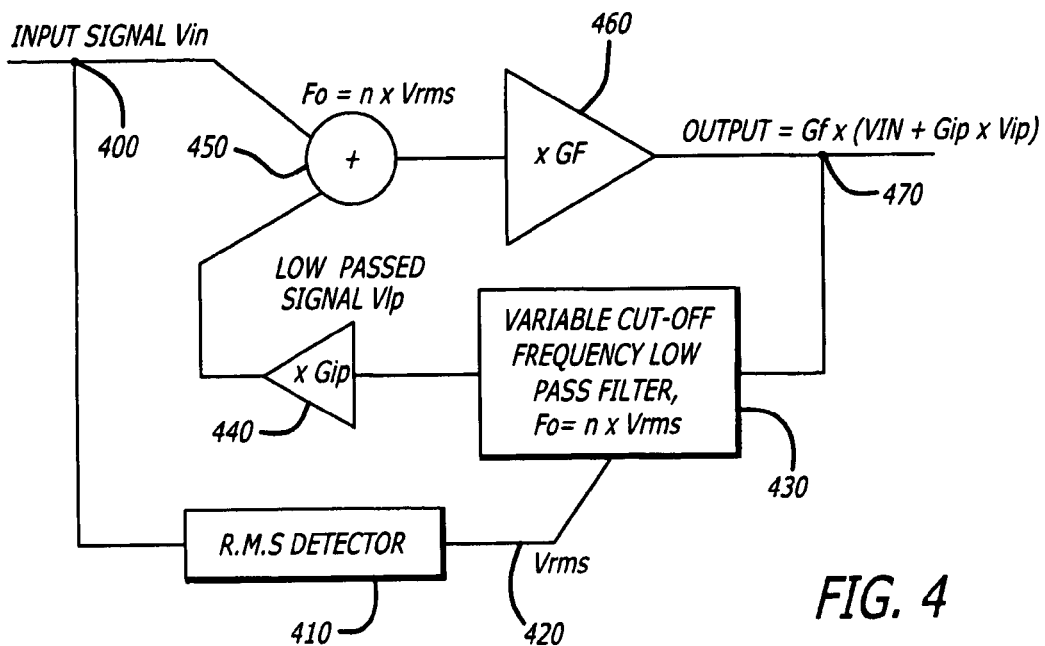
FIG. 4 is a simplified circuit diagram of the auto loudness compensation circuit of the present invention.

FIG. 4 is a block diagram of the automatic loudness compensation circuit in one embodiment of the present invention, the positive feedback low frequency boosting arrangement. An input audio signal, $V_{in}$ 400, is received by the circuit and supplied to an r.m.s. detector 410. In this embodiment, the r.m.s. value of the voltage is used because the r.m.s. value closely indicates the perceived volume level or acoustic power. The r.m.s. detector 410 produces an d.c. output voltage, $V_{rms}$ 420, which is a DC voltage proportional to the r.m.s. level of the AC input audio signal. $V_{rms}$ 420 is then supplied to the variable cut-off frequency low pass filter 430. The low passed signal is attenuated by an op amp buffered or passive attenuator 440 and a low passed voltage, $V_{lp}$ is summed with the input audio signal by summing circuit 450. The signal is then amplified by amplifier 460 and provided to the output terminal 470 of the circuit of the present invention.

Figure 5A:
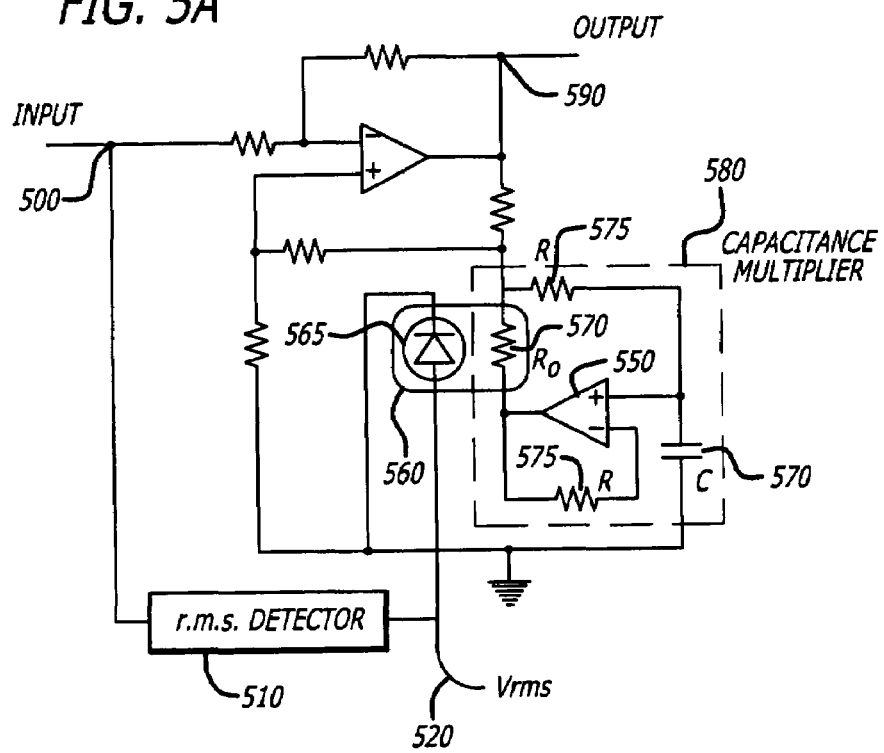
FIG. 5A is a circuit diagram of the present circuit utilizing a capacitance multiplier controlled by an opto coupled resistor.
Figure 5B:
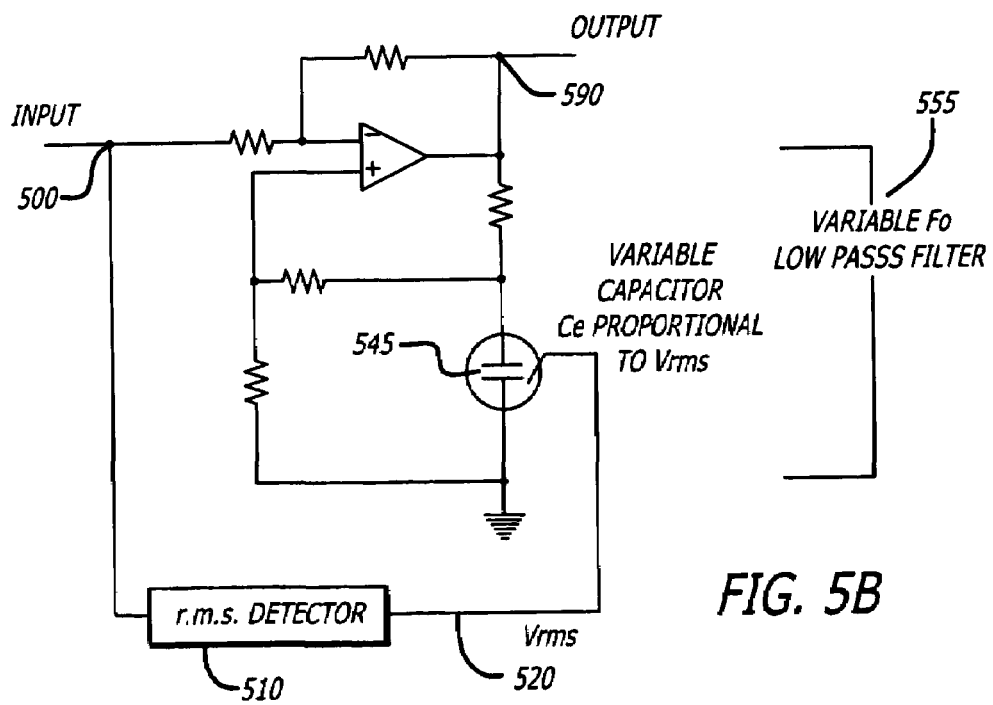
FIG. 5B is a simplified circuit diagram of the present circuit shown with a variable capacitor.

Referring to FIGS. 5A and 5B, a schematic diagram for the circuit of one aspect of the present invention is shown. In FIG. 5A, an AC input signal 500 is received and then supplied to an r.m.s. detector 510. The r.m.s. detector 510 produces a d.c. output voltage, $V_{rms}$ 520, which is then supplied to a light emitting diode (LED) 565. The degree of illumination of the LED 565 controls the resistance of resistor $R_0$ 570, which is part of a capacitance multiplier circuit. The capacitance multiplier circuit 530 includes capacitor 540, operational amplifier 550 and resistors R 575 and $R_0$ 570. In operation, when the $V_{rms}$ 520 is high, LED 565 is energized and the light is on. $R_0$ 570 is an opto-coupled resistor and operates inversely with the LED 565. Thus, when the LED 565 is energized or on, the resistance across $R_0$ 570 decreases quickly and when the LED 565 is de-energized or off, the resistance across $R_0$ 570 increases slowly. Referring now to FIG. 5B, the capacitance multiplier circuit 530 is shown as an equivalent variable capacitor, $C_e$ 545, wherein:

$$C_e = \left(\frac{R}{R_0}\right)C \qquad 1.1$$

Thus, $C_e$ is inversely proportional to $R_0$:

$$C_e \propto \frac{1}{R_0} \qquad 1.2$$

Further, since capacitance is inversely related to frequency, the corner frequency, $f_c$ is inversely proportional to $C_e$:

$$f_c \propto \frac{1}{C_e} \qquad 1.3$$

and then it is seen that $$f_c \propto R_0 \qquad 1.4$$

Finally, since the total bass boost at low frequencies (B) is proportional to the filter passband the amount of bass boosting is proportional to the corner frequency:

$$B \propto f_c \qquad 1.5$$

And therefore, $$B \propto R_0 \qquad 1.6$$

Thus, the variable capacitor $C_e$ 545 when fed from the signal output 590 via a resistor functions as a variable low pass filter 555. In order to control the corner frequency, $f_c$ of the low pass filter 555, the value of the resistance across $R_0$ 570 (FIG. 5A) is adjusted per equation 1.4. The result of the above interrelationships of the capacitance multiplier circuit components or variable capacitance, $C_e$ 545, is to provide an output signal 590 in which bass boost increases slowly when the input signal 500 is decreasing. Further, the circuit provides an output signal 590 in which bass boost decreases quickly when the input signal 500 is increasing.

Figure 6:
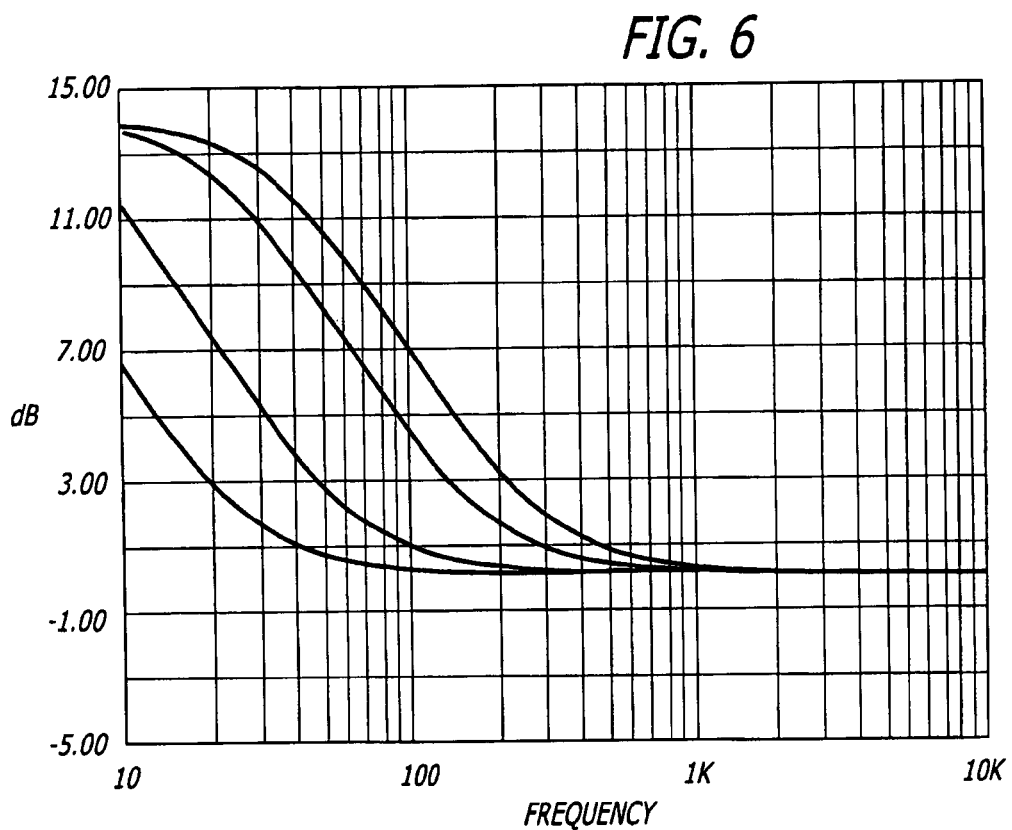
FIG. 6 is a frequency domain relative level diagram simulating the various frequency response curves as a result of the circuit of the present invention.

FIG. 6 shows a frequency domain gain diagram (or frequency response) of the frequency responses which results from the circuit of the present invention. The waveforms of FIG. 6 closely mimic the Fletcher-Munson waveforms of FIG. 2 normalized about 1 kHz.

In yet another embodiment of the present invention, a digital signal processing system modifies the order of the filter in addition to varying the corner frequency of the filter circuit. Thus, the waveforms resulting from this embodiment are more closely modeled to the Fletcher-Munson curves.

In yet another embodiment, the present invention considers an arbitrary function mapping system between the input and output signal variables. For example, a fuzzy system based signal processing scheme may be used to provide a "soft" computing mechanism for the associated system parameters such as signal power, corner frequency, amount of boost, etc. There exist several journals such as IEEE Trans. on Fuzzy Systems, Fuzzy Sets and Systems, etc., and texts such as, "Fuzzy Logic with Engineering Applications," by Timothy Ross, McGraw-Hill, 1995, etc., that discusses the methodology of fuzzy computing, which is hereby incorporated by reference into this application. FIGS. 7(a)–(e) illustrate by way of example one method of using fuzzy logic computing in accordance with the present invention.

Figure 7B:
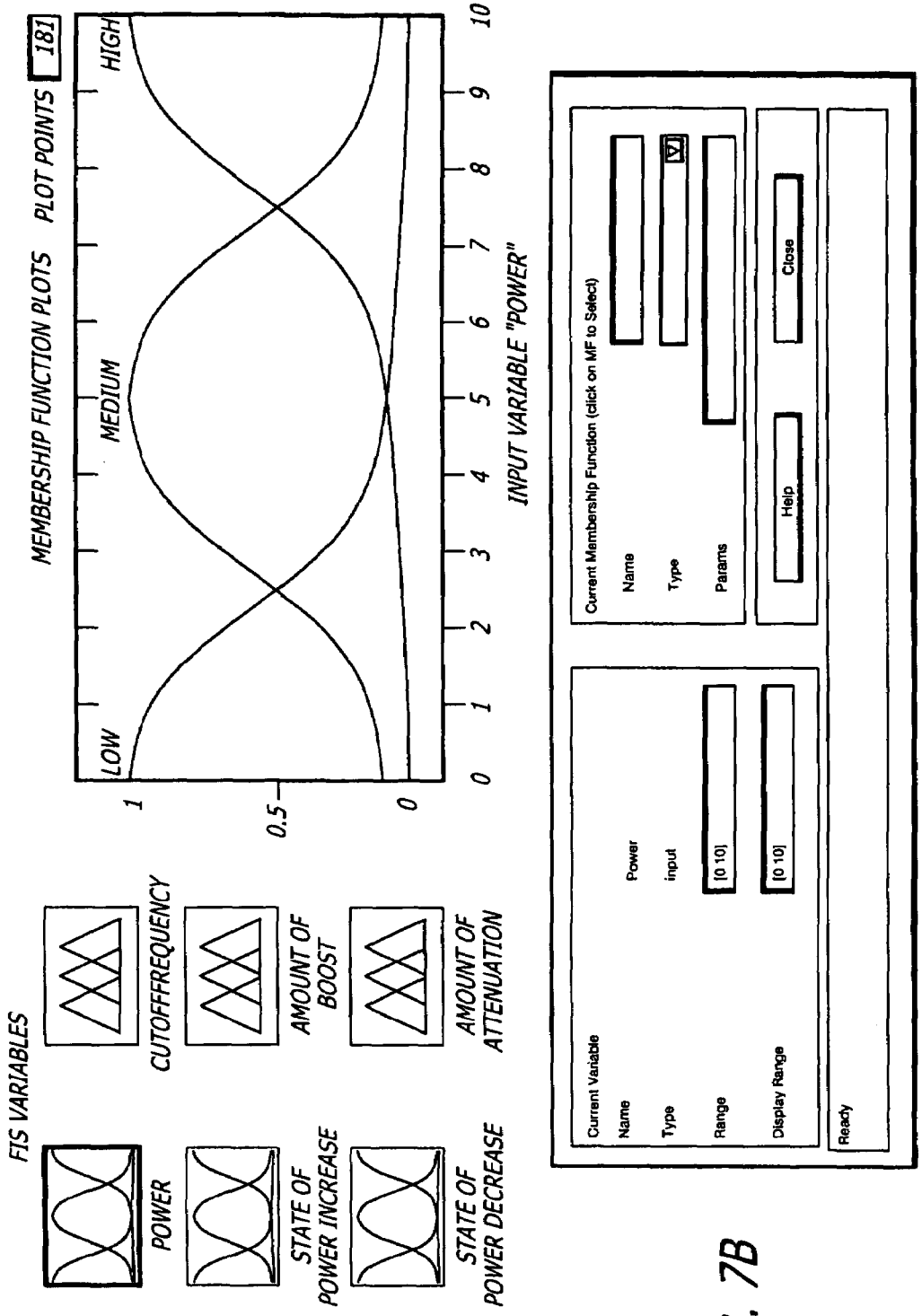
FIG. 7B shows a way of encoding the input variable labeled signal power.
Figure 7C:
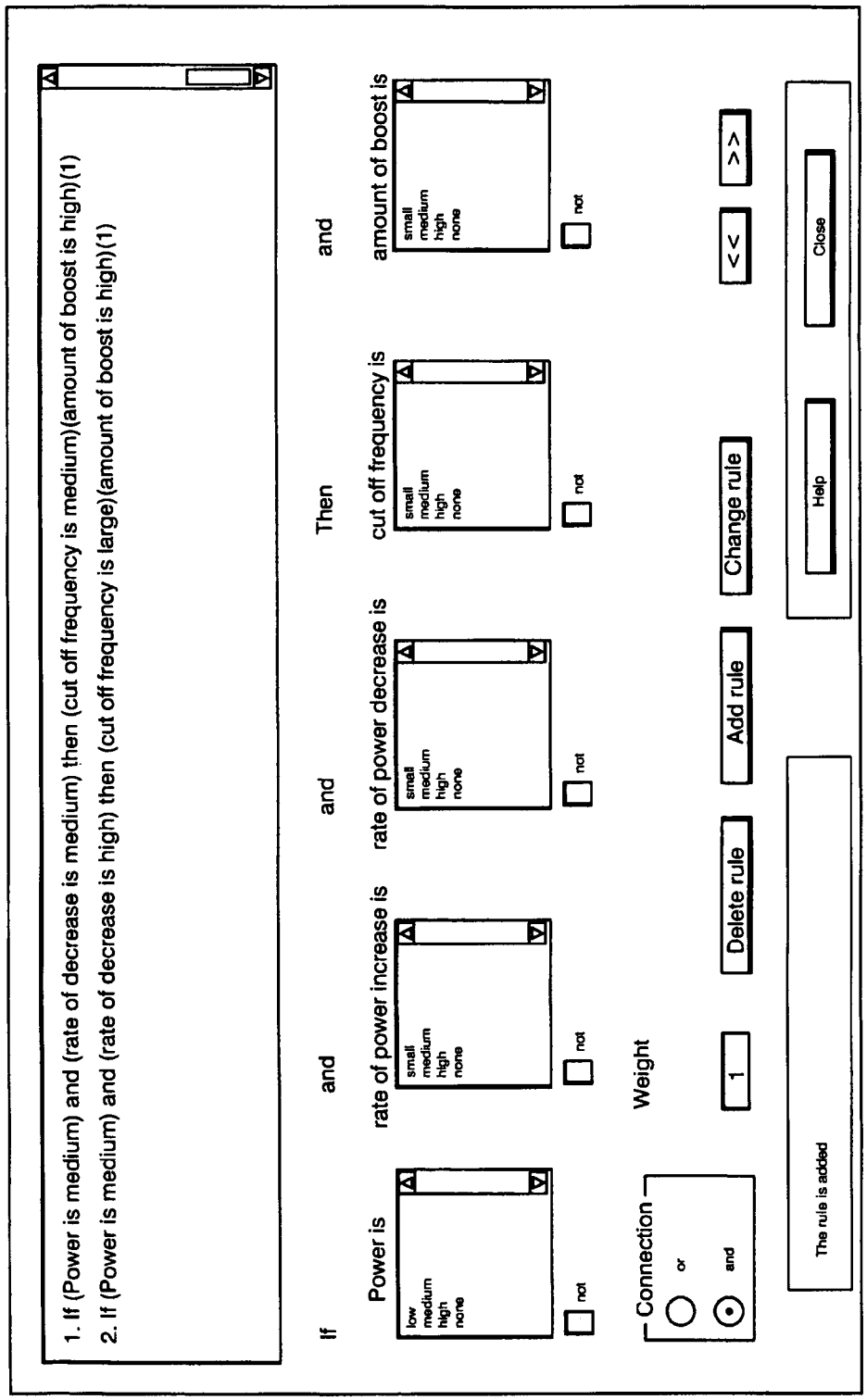
FIG. 7C shows a rule base generated by an expert.
Figure 7D:
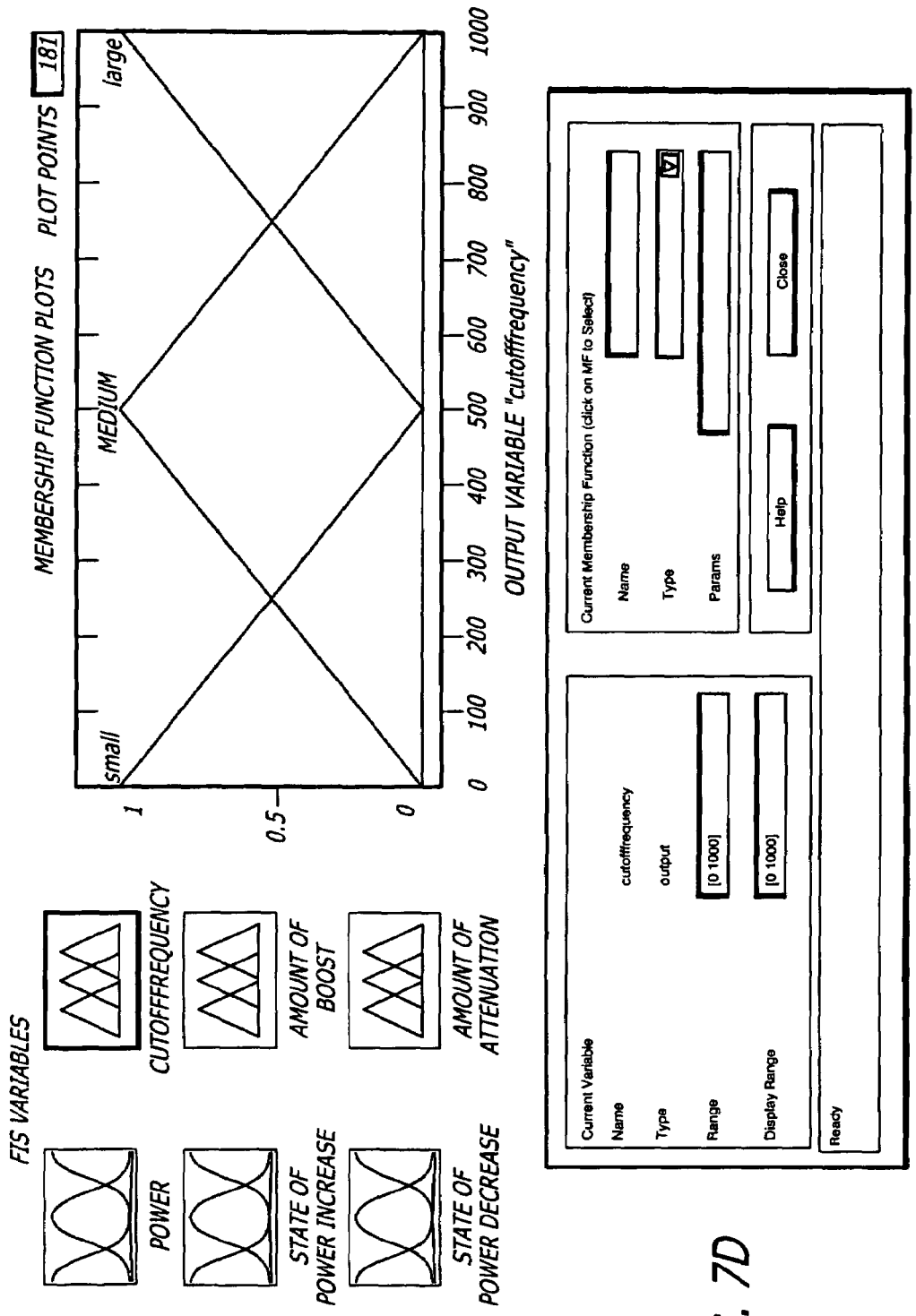
FIG. 7D shows a way of decoding the fuzzy variables from the rule base to determine the output variable labeled cutoff frequency.
Figure 7E:
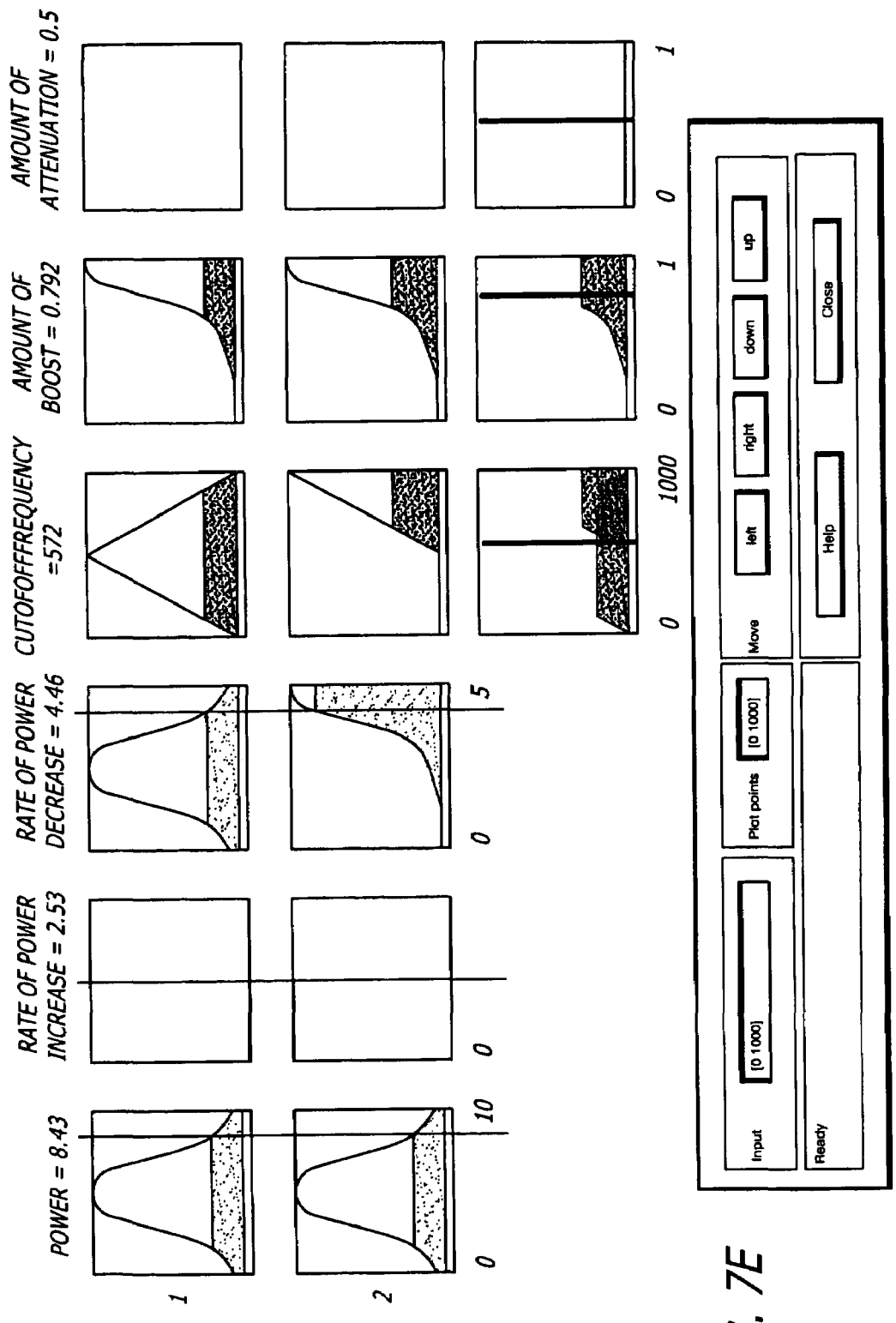
FIG. 7E shows an exemplary computation performed by the fuzzy system.

In FIG. 7(a), exemplary input parameters (input variables) are provided, such as, signal power 702, rate of increase of signal power 704, rate of decrease of signal power 706. Other input variables such as direction of change in input power may be also used (not shown). These inputs are "fuzzified" by suitable fuzzy sets as shown in FIG. 7(b). These fuzzy sets are also known as membership functions and are expert generated. The fuzzification scheme is an encoding scheme so that the next step in the computing process, an expert generated rulebase, can use this information. As an example, for the input parameter labeled "signal power," the expert may use the three fuzzy sets, low, medium and high. That is, when the input signal power is 9 W, the encoder provides two nonzero output values. One approximate output is 0.25 for the medium fuzzy set, and the other output is approximately 0.8 for the high fuzzy set. These outputs are fed to a rule base that contains expert generated rules. For example, FIG. 7(c) illustrates by way of example, two rules in the rule base. Only those outputs from the encoder that "activate" the antecedent portion of the rules in the rulebase are typically used to compute the outputs from the rulebase. The outputs are computed from the appropriate consequent of the rulebase and provided as input to the decoder also known as the defuzzifier. The decoder performs an inverse mapping from the fuzzy variables to crisp variables. FIG. 7(d) illustrates by way of an example the decoder for the output labeled cutoff frequency. In a typical computing environment, an input signal power of 8.43 W, and rate of decrease of power (4.46, an arbitrary exemplary scale) is provided to the system, as shown in FIG. 8(e). The computed output values for the signal boost and cutoff frequency are 0.792 and 572 Hz. Several variations of the system can be incorporated (e.g., adaptive encoding and decoding elements, etc.) for finer results.

It will be appreciated that the term "present invention" as used herein should not be construed to mean that only a single invention having a single essential element or group of elements is presented. Rather, each novel and nonobvious element constitutes a separate invention. Further, each novel and nonobvious combination of elements enabled by the present disclosure, whether the individual elements therein be old elements, new elements, or any combination thereof, further constitutes an additional separate invention.

Although the present invention has thus been described in detail with regard to the preferred embodiments and drawings thereof, it should be apparent to those skilled in the art that various adaptations and modifications of the present invention may be accomplished without departing from the spirit and the scope of the invention. Accordingly, it is to be understood that the detailed description and the accompanying drawings as set forth hereinabove are not intended to limit the breadth of the present invention, which should be inferred only from the following claims and their appropriately construed legal equivalents. In the following claims, those claims which contain the words "means for" are intended to be interpreted in accordance with 35 U.S.C. § 112, paragraph 6; those claims which do not include the words "means for" are intended to not be interpreted in accordance with 35 U.S.C. § 112, paragraph 6. The corresponding structures, materials, acts, and equivalents of all means or step plus function elements in the claims below are intended to include any structure, material, or act for performing the function in combination with other claimed elements as specifically claimed.

The invention claimed is:

1. A method of providing an automatic loudness compensation circuit comprising:
   receiving an input audio signal with a full audible frequency band having a high, mid, and low range of frequencies where the low range represents a bass content;
   coupling the input audio signal to a voltage detector having an output voltage;
   coupling the output voltage of the voltage detector to a filter circuit for adjusting a corner frequency associated with the filter circuit such that the corner frequency is inversely related to the input audio signal for boosting the bass content of the input audio signal; and
   coupling an output of the filter circuit to a power amplifier for amplifying the filter circuit output.

2. The method of claim 1 wherein the method further comprises driving an audio speaker with the amplified filter circuit output.

3. The method of claim 1 wherein the filter circuit further comprises a capacitance multiplier circuit comprising a light emitting device coupled to a light sensitive resistor.

4. The method of claim 3 wherein the capacitance multiplier circuit further comprises a low pass filter coupled to the light emitting device and the light sensitive resistor.

5. The method of claim 4 wherein the filter circuit adjusts the corner frequency of the low pass filter within an operating frequency range.

6. The method of claim 5 wherein the filter circuit adjusts the corner frequency of the low pass filter such that the corner frequency is increased when the input audio signal decreases.

7. The method of claim 3 wherein the amount boost to the bass content of the input audio signal is proportional to the corner frequency of the low pass filter.

8. The method of claim 3 wherein the amount boost to the bass content of the input audio signal is proportional to the value of the light sensitive resistor.

9. The method of claim 1 wherein the source of the input audio signal is a compact disc.

10. The method of claim 1 wherein the source of the input audio signal is a cassette.

11. The method of claim 1 wherein the source of the input audio signal is a digital video disc.

12. The method of claim 1 wherein the source of the input audio signal is a microphone.

13. The method of claim 12 wherein the output of the filter circuit and the microphone input audio signal are coupled to a summing circuit having an output signal.

14. The method of claim 13 wherein the output of the summing circuit is coupled to the power amplifier.

15. A method of providing an automatic loudness compensation circuit comprising:
   receiving an input audio signal with a full audible frequency band having a high, mid, and low range of frequencies where the low range represents a bass content;
   coupling the input audio signal to a voltage detector to produce an output voltage;
   coupling the output voltage of the voltage detector to a control circuit, the control circuit comprising a filter circuit;
   comparing a corner frequency associated with the filter circuit to the strength of the input audio signal;
   shifting the corner frequency such that the corner frequency is inversely related to the strength of the input audio signal;
   coupling an output of the filter circuit to a power amplifier for amplifying the filter circuit output; and
   driving an audio speaker with the amplified filter circuit output.

16. The method of claim 15, further comprising:
   utilizing a capacitance multiplier circuit comprising a light emitting device coupled to a light sensitive resistor having an output signal wherein the output of the light sensitive resistor is coupled to a low pass filter for adjusting the bass content of the input audio signal.

17. The method of claim 16, further comprising:
   responding to an increase in the input audio signal by energizing the light emitting device within the filter circuit to produce a light source; and
   decreasing the resistance of the light sensitive resistor; and
   increasing the value of the capacitor in order to shift the corner frequency such that bass boosting of the audio input signal is quickly removed.

18. The method of claim 16 further comprising:
   responding to a decrease in the audio input signal by de-energizing the light emitting device within the filter circuit in order to prevent a light source;
   increasing the resistance of the light sensitive resistor; and
   decreasing the value of the capacitor in order to shift the corner frequency such that bass boosting of the audio input signal is slowly added.

19. The method of claim 15 wherein the amount boost to the bass content of the input audio signal is proportional to the corner frequency of the filter circuit.

20. The method of claim 16 wherein the amount boost to the bass content of the input audio signal is proportional to the value of the light sensitive resistor.

21. The method of claim 16, wherein the light sensitive resistor is an opto-coupled resistor.

22. An automatic loudness compensation circuit including a terminal coupled to an input audio signal from an external source and a signal supply having voltage sufficient to drive an output audio speaker comprising:
   an R.M.S. detector for providing an R.M.S. voltage from the input audio signal with a full audible frequency band having a high, mid, and low range of frequencies where the low range represents a bass content;

a control circuit including a filter circuit for adjusting a corner frequency associated with the filter circuit such that the corner frequency is inversely related to the input audio signal;

a power amplifier for increasing the power of the output signal from the filter circuit; and a terminal for providing an amplified output signal.

23. The automatic loudness compensation circuit of claim 22 wherein the control circuit provides a boost to the input audio signal containing a bass content such that the boost is proportional to the corner frequency of the filter circuit.

24. The automatic loudness compensation circuit of claim 22 wherein the filter circuit further comprises a light emitting device coupled to a light sensitive resistor having an output signal wherein the output of the light sensitive resistor is coupled to a low pass filter.

25. The automatic loudness compensation circuit of claim 24 wherein the control circuit provides a boost to the input audio signal containing a bass content such that the boost is proportional to the output of the light sensitive resistor.

26. An automatic loudness compensation circuit including a terminal coupled to an input audio signal from an external source and a signal supply having voltage sufficient to drive an output audio speaker comprising:

means for detecting an R.M.S. voltage from the audio input signal with a full audible frequency band having a high, mid, and low range of frequencies where the low range represents a bass content;

means for adjusting a corner frequency of a filter circuit such that the corner frequency is inversely related to the audio input signal;

means for amplifying the output signal from the filter circuit; and a terminal for providing an amplified output signal.

27. A system for obtaining a first order bass boost compensation comprising:

a terminal for receiving an audio input signal having a signal level;

a level control for determining the level of the input audio signal with high, mid, and low range of frequencies where the low range represents a bass content;

an automatic loudness compensation circuit comprising:

a power supply voltage having voltage sufficient to drive an output audio speaker;

an R.M.S. detector coupled to the power supply voltage for providing an R.M.S. voltage from the input audio signal; and a control circuit coupled to the R.M.S. detector comprising a filter having an associated corner frequency, the control circuit for adjusting the corner frequency such that the corner frequency is inversely related to the input audio signal to generate a low pass signal;

a summing circuit coupled to the automatic loudness compensation circuit, the summing circuit summing the audio input signal and the low pass signal to generate an output signal;

a power amplifier coupled to the summing circuit for increasing the power of the output signal from the summing circuit; and a terminal for providing an amplified output signal to an audio speaker.

28. The method of claim 27, wherein the audio input signal is received from a compact disc player.

29. The method of claim 27, wherein the audio input signal is received from a cassette player.

30. The method of claim 27, wherein the audio input signal is received from a digital video disc player.

31. A system for obtaining an automatic loudness compensation comprising:

a input terminal for receiving an audio input signal having a signal level with a full audible frequency band having a high, mid, and low range of frequencies where the low range represents a bass content;

a level control coupled to the input terminal for determining the level of the input audio signal;

an automatic loudness compensation circuit coupled to the level control, the automatic loudness compensation circuit comprising a filter circuit for adjusting a corner frequency associated with the filter circuit such that the corner frequency is inversely related to the audio input signal, to generate a low pass signal;

a summing circuit coupled to the automatic loudness compensation circuit, the summing circuit summing the audio input signal and the low pass signal to generate an output signal;

a power amplifier coupled to the summing circuit for increasing the power of the output signal from the summing circuit; and an output terminal coupled to an audio speaker for providing an amplified output signal to the audio speaker.

* * * * *